(12) United States Patent
LaMeres et al.

(10) Patent No.: US 7,323,892 B1
(45) Date of Patent: Jan. 29, 2008

(54) PROBE HAVING A FRAME TO ALIGN SPRING PINS PERPENDICULARLY TO A PRINTED CIRCUIT BOARD, AND METHOD OF MAKING SAME

(75) Inventors: Brock J. LaMeres, Colorado Springs, CO (US); Brent Holcombe, Colorado Springs, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 11/448,700

(22) Filed: Jun. 7, 2006

(51) Int. Cl.
*G01R 31/02* (2006.01)

(52) U.S. Cl. .................. 324/754; 324/758; 324/761

(58) Field of Classification Search .............. None
See application file for complete search history.

(56) References Cited

U.S. PATENT DOCUMENTS

| | | | |
|---|---|---|---|
| 4,232,928 A | 11/1980 | Wickersham | |
| 4,528,500 A | 7/1985 | Lightbody et al. | |
| 4,724,377 A | 2/1988 | Maelzer et al. | |
| 4,743,839 A | 5/1988 | Rush | |
| 4,837,507 A * | 6/1989 | Hechtman | 324/758 |
| 4,912,400 A | 3/1990 | Plante | |
| 4,963,822 A | 10/1990 | Prokopp | |
| 5,157,325 A | 10/1992 | Murphy | |
| 5,172,051 A * | 12/1992 | Zamborelli | 324/72.5 |
| 5,223,787 A | 6/1993 | Smith et al. | |
| 5,534,787 A | 7/1996 | Levy et al. | |
| 5,646,542 A * | 7/1997 | Zamborelli et al. | 324/755 |
| 6,046,597 A * | 4/2000 | Barabi | 324/755 |
| 6,150,830 A | 11/2000 | Schmid et al. | |
| 6,222,377 B1 * | 4/2001 | Kato | 324/754 |
| 6,575,772 B1 | 6/2003 | Soubh et al. | |
| 6,822,466 B1 | 11/2004 | Holcombe et al. | |
| 6,867,609 B2 | 3/2005 | Holcombe et al. | |
| 7,046,020 B2 | 5/2006 | LaMeres et al. | |

FOREIGN PATENT DOCUMENTS

EP 0513992 A1 6/1992

OTHER PUBLICATIONS

"Soft Touch Connectorless Logic Analyzer Probes—Models E5387A, E5390A, and E5394A"; Agilent Technologies; http://www.agilent.com; Jun. 5, 2003; 2 pp.

* cited by examiner

*Primary Examiner*—Minh N. Tang

(57) ABSTRACT

In one embodiment, a probe for probing test points on a target board includes a printed circuit board, a frame, and a plurality of spring pins. The printed circuit board (PCB) has a first side with a plurality of solder pads thereon, and a plurality of signal routes that are electrically coupled to the solder pads for routing signals to a test instrument. The frame is mechanically coupled to the PCB and has a main body portion with a plurality of holes therein. The holes in the frame are aligned with the plurality of solder pads on the first side of the PCB. The plurality of spring pins are provided for probing the test points on the target board, with each spring pin being i) disposed in one of the holes in the frame, perpendicularly abutting the first side of the PCB, and ii) electrically coupled to one of the solder pads. Other embodiments, including a method of making a probe, are also disclosed.

11 Claims, 7 Drawing Sheets

PROBE HAVING A FRAME TO ALIGN SPRING PINS PERPENDICULARLY TO A PRINTED CIRCUIT BOARD, AND METHOD OF MAKING SAME

BACKGROUND

Connector-less probing has emerged as an attractive form of probing for logic analyzers and other test equipment. In connector-less probing, a customer designs their printed circuit board (PCB) to incorporate a "landing pattern" of test points. The customer then attaches a connector-less probe to their test equipment, and mounts the connector-less probe to their PCB so that a plurality of spring-pins on the probe engage the plurality of test points in their PCB's landing pattern.

One embodiment of a connector-less probe is disclosed in the United States patent application of Brent A. Holcombe, et al. entitled "Connector-Less Probe" (Ser. No. 10/373,820, filed Feb. 25, 2003). An alignment/retention device for mounting a connector-less probe to a PCB is disclosed in the United States patent application of Brent A. Holcombe, et al. entitled "Alignment/Retention Device For Connector-Less Probe" (Ser. No. 10/644,365, filed Aug. 20, 2003).

Connector-less probes for probing a plurality of breakout vias on the backside of a printed circuit board to which a grid array package is attached are disclosed in the United States patent application of Brock J. LaMeres, et al. entitled "Backside Attach Probe, Components Thereof, and Methods for Making and Using Same" (Ser. No. 10/902,405, filed Jul. 28, 2004). One embodiment of a probe with perpendicularly disposed spring pins is disclosed in the United States patent application of Brock J. LaMeres, et al. entitled "Probes With Perpendicularly Disposed Spring Pins, And Methods of Making and Using Same" (Ser. No. 10/781,086, filed Feb. 17, 2004).

Agilent Technologies, Inc. (headquartered in Palo Alto, Calif.) markets a number of connector-less probing solutions under the name "Soft Touch".

SUMMARY OF THE INVENTION

In one embodiment, a probe for probing test points on a target board comprises a printed circuit board, a frame, and a plurality of spring pins. The printed circuit board (PCB) has a first side with a plurality of solder pads thereon, and a plurality of signal routes that are electrically coupled to the solder pads for routing signals to a test instrument. The frame is mechanically coupled to the PCB and has a main body portion with a plurality of holes therein. The holes in the frame are aligned with the plurality of solder pads on the first side of the PCB. The plurality of spring pins are provided for probing the test points on the target board, with each spring pin being i) disposed in one of the holes in the frame, perpendicularly abutting the first side of the PCB, and ii) electrically coupled to one of the solder pads.

In another embodiment, a method of forming a test probe comprises 1) aligning a plurality of holes in a frame with a plurality of solder pads on a first side of a PCB, and mechanically coupling the frame to the PCB; 2) depositing a plurality of spring pins into the holes in the frame, causing the spring pins to i) extend perpendicularly from the PCB and through the frame, so that tips of the spring pins are exposed to make contact with, and apply pressure to, a plurality of test points on a target board, and ii) make contact with respective ones of the solder pads on the PCB; and 3) heating the probe to cause reflow of the solder pads, thereby mechanically and electrically coupling the spring pins to the solder pads.

Other embodiments are also disclosed.

BRIEF DESCRIPTION OF THE DRAWINGS

Illustrative embodiments of the invention are illustrated in the drawings, in which.

DETAILED DESCRIPTION

Connector-less probing provides both electrical and mechanical advantages over traditional probing. Electrically, connector-less probing provides for the placement of tip-network components closer to where signals are being sampled. This can reduce electrical loading on a target board and provide higher signal fidelity to a test instrument. Mechanically, connector-less probing eliminates a customer's need to provide test connectors on each of their PCBs. Rather, test access is merely provided by designing a board to include a landing pattern of test points. Also, unlike the larger and more intrusive footprints that are needed for connector mounting, the footprints needed for connector-less probing are smaller and less intrusive. This makes it easier to incorporate connector-less probe landing patterns on both prototype and production boards (while only minimally or not at all impacting the functionality of the production boards).

A disadvantage of currently available connector-less probes is their vertical space requirement. That is, the bodies of currently available connector-less probes extend substantially perpendicular from a target board's landing pattern. However, at times, a customer needs to test a board in an environment with little Z-axis access to the board's landing pattern (e.g., a landing pattern on a motherboard mounted inside of a chassis). Under such circumstances, it is difficult if not impossible to mount a connector-less probe to the landing pattern. Connector-less probes that can be maneuvered in environments with little Z-axis would therefore be desirable.

Figure 1:
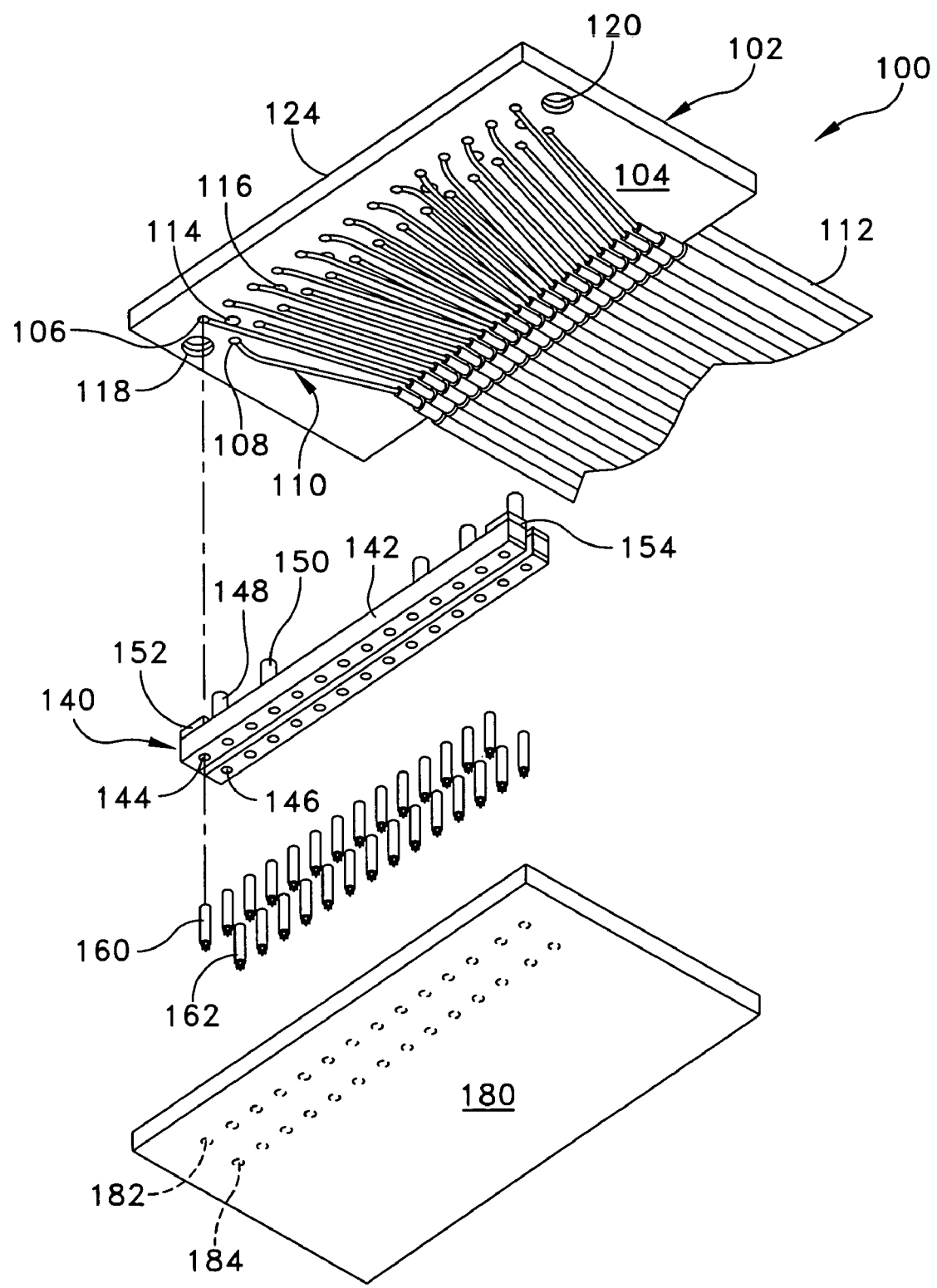
FIG. 1 shows a first exploded perspective view of the components of a first exemplary test probe.

FIGS. 1-4 illustrate one exemplary embodiment of a connector-less probe 100 for probing test points 182, 184 on a target board 180. As best shown in the FIG. 1 "exploded view", the probe 100 comprises a printed circuit board (PCB) 102 having a first side 104 with a plurality of exposed solder pads 106, 108 thereon. A plurality of signal routes 110 (thereon or therein) are electrically coupled to the solder pads 106, 108, as shown in FIG. 1. The signal routes 110 are provided for routing signals to a test instrument (e.g., via one or more ribbon cables 112). As used herein, the term "signal route" encompasses both PCB traces, as well as components that may be coupled to or formed within signal traces.

The probe 100 also comprises a frame 140 that is mechanically coupled to the PCB 102. The frame 140 has a main body portion 142 having a plurality of holes 144, 146 disposed therein. The plurality of holes 144, 146 are spaced for alignment with the plurality of exposed solder pads 106, 108 on the first side 104 of the PCB 102, as shown in FIG. 1. The frame 140 may be formed using various materials, but is preferably formed from a rigid, non-conductive plastic.

Figure 2:
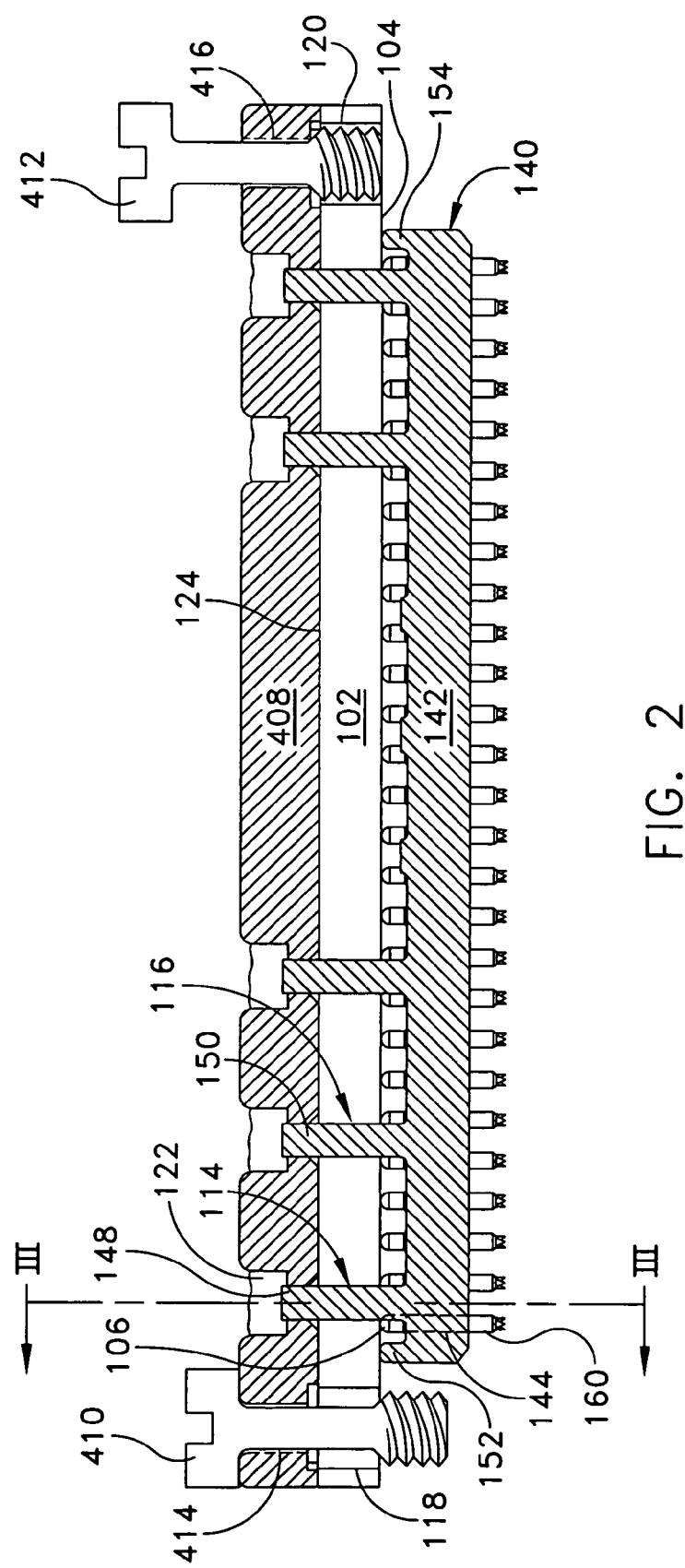
FIG. 2 illustrates a first assembled cross-section of the probe shown in FIG. 1.
Figure 3:
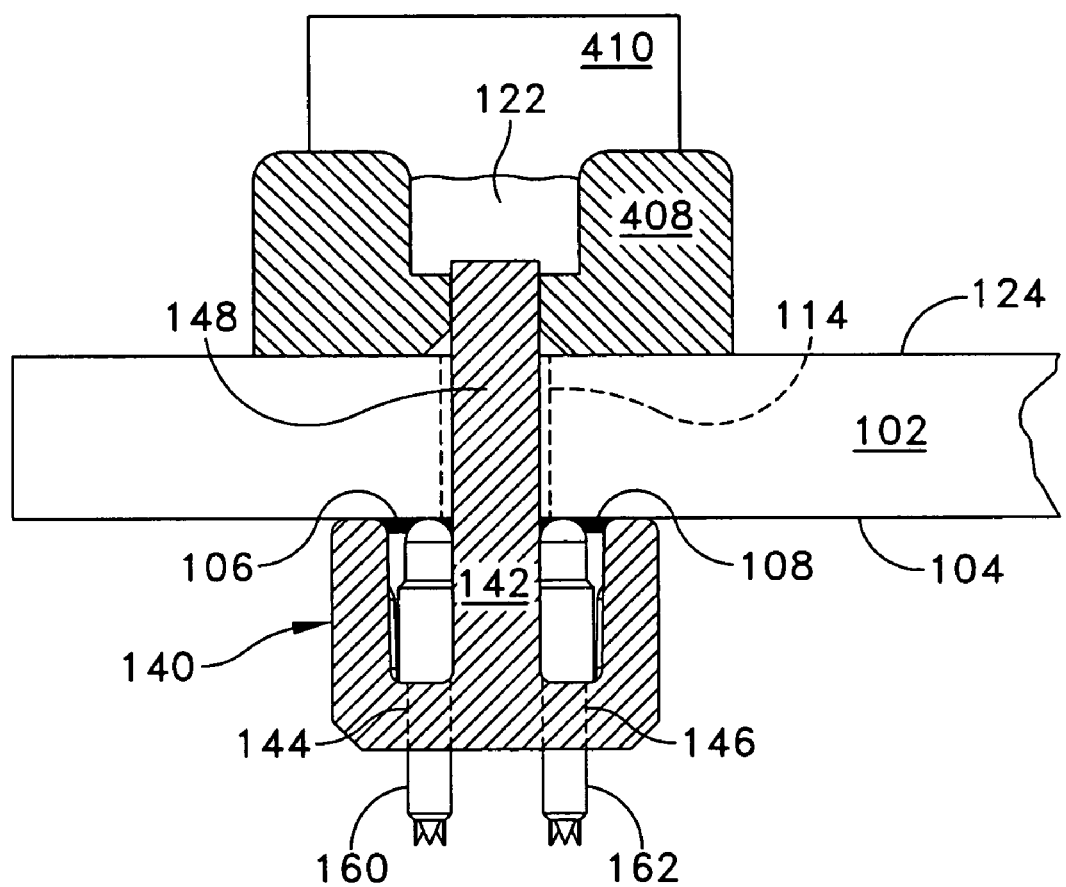
FIG. 3 illustrates a second assembled cross-section of the probe shown in FIG. 1.

As shown in FIGS. 2 & 3, the PCB 102 may have a plurality of holes 114, 116 formed therein for receiving corresponding posts 148, 150 of the frame 140. The posts 148, 150 extend perpendicularly from the main body portion 142 of the frame 140. In some embodiments the main body portion 142 and posts 148, 150 may be formed using the same material. In other embodiments, the main body portion 142 and posts 148, 150 may be formed from different materials.

Figure 5:
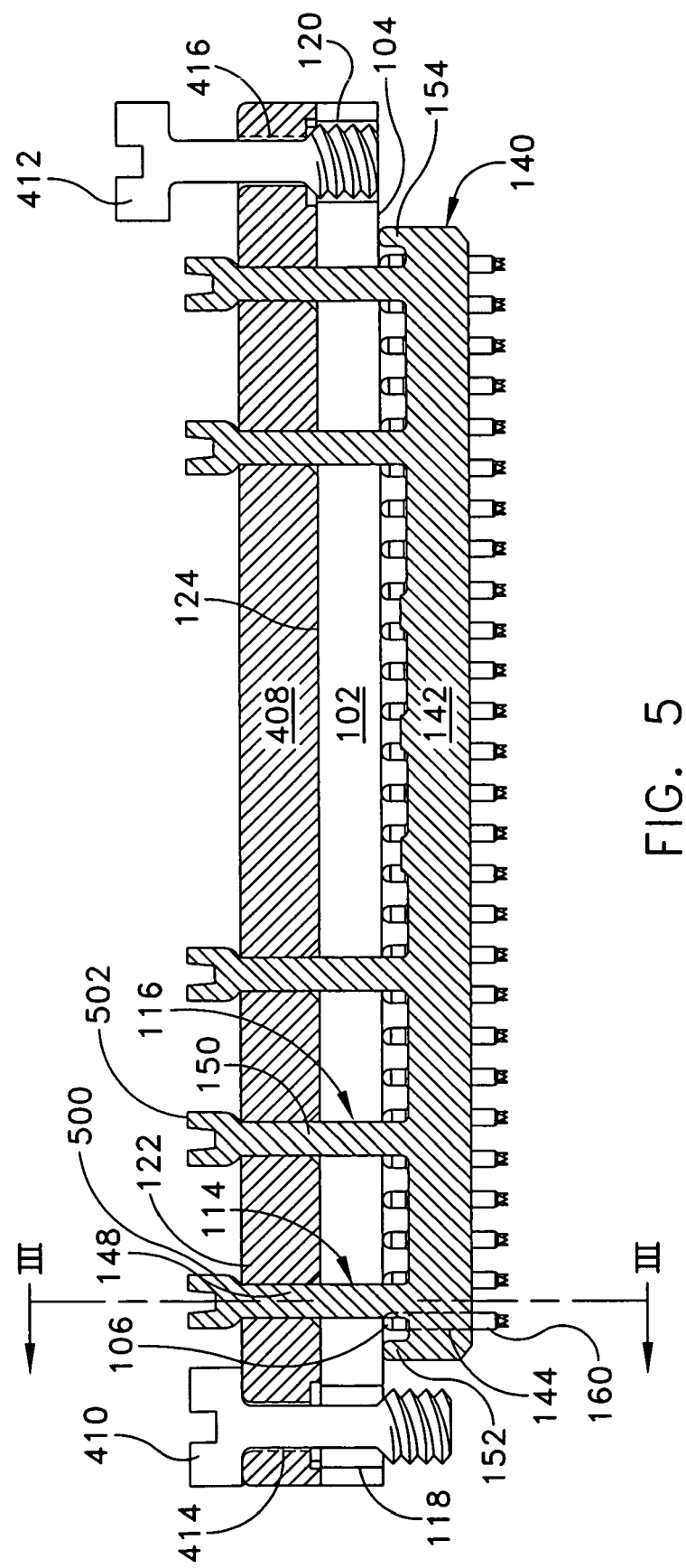
FIG. 5 illustrates an alternate way to couple the frame and PCB of the probe shown in FIG. 1.

In one embodiment, the posts 148, 150 of the frame 140 pass through the PCB 102 and mate with holes 418, 420 in a plate 408 that is positioned adjacent a second side 124 of the PCB 102 (opposite the first side 104). An adhesive 122 deposited on top of the posts 148, 150 and plate 408 (or deposited within the holes 418, 420 of the plate 408) then secures the frame 140 to the plate 408, clamping the PCB 102 therebetween. The adhesive 122 may comprise any suitable adhesive material, such as an epoxy resin, for example. Although the frame 140 or plate 408 could alternately, and each, be directly attached to the PCB 102, joinder of the frame 140 and plate 408 dispenses with any need to apply an adhesive or other attachment mechanism to the PCB 102 that supports the somewhat sensitive signal traces 110. As shown in FIG. 5, the frame 140 could alternately be secured to the PCB 102, or to the plate 408, via a snap-type or compression mechanism, such as enlarged and slightly deformable ends 500, 502 of the posts 148, 150 of the frame 140.

The probe 100 may also comprise a plurality of spring pins 160, 162 for probing the test points 182, 184 on the target board 180. The spring pins 160, 162 are disposed within the holes 144, 146 in the frame 140, after the frame 140 is attached to the PCB 102, so that the spring pins 160, 162 perpendicularly abut the first side 104 of the PCB 102. Preferably, the holes 144, 146 do not frictionally engage the spring pins 160, 162, thereby enabling unrestricted movement of the spring pins 160, 162 within the holes. However, it is also preferable that the unrestricted movement of the spring pins 160, 162 be limited so that the spring pins 160, 162 are maintained 1) in substantially parallel positions with respect to one another, and 2) in alignment with their respective solder pads 106, 108.

Once the spring pins 160, 162 are inserted or deposited into the holes 144, 146 of the frame 140, the probe 100 may be heated in a reflow oven to cause the solder of the solder pads 106, 108 to wet and bond to the spring pins 160, 162. In this manner, each of the spring pins 160, 162 is mechanically and electrically coupled to one of the solder pads 106, 108, as shown in FIGS. 2 & 3.

In some cases, it may be undesirable for the main body portion 142 of the frame 140 to fully contact the first side 104 of the PCB 102. For example, it may be desirable to provide some space for the solder of the solder pads 106, 108 to reflow. The frame 140 may therefore comprise a plurality of feet 152, 154 that extend from the main body portion 142 of the frame 140, toward the first side 104 of the PCB 102, to provide a predetermined spacing between the PCB 102 and the main body portion 142 of the frame 140 (see FIG. 2). Alternately, the PCB-facing openings of the holes 144, 146 could be beveled or otherwise enlarged to provide adequate space for solder reflow.

Figure 4:
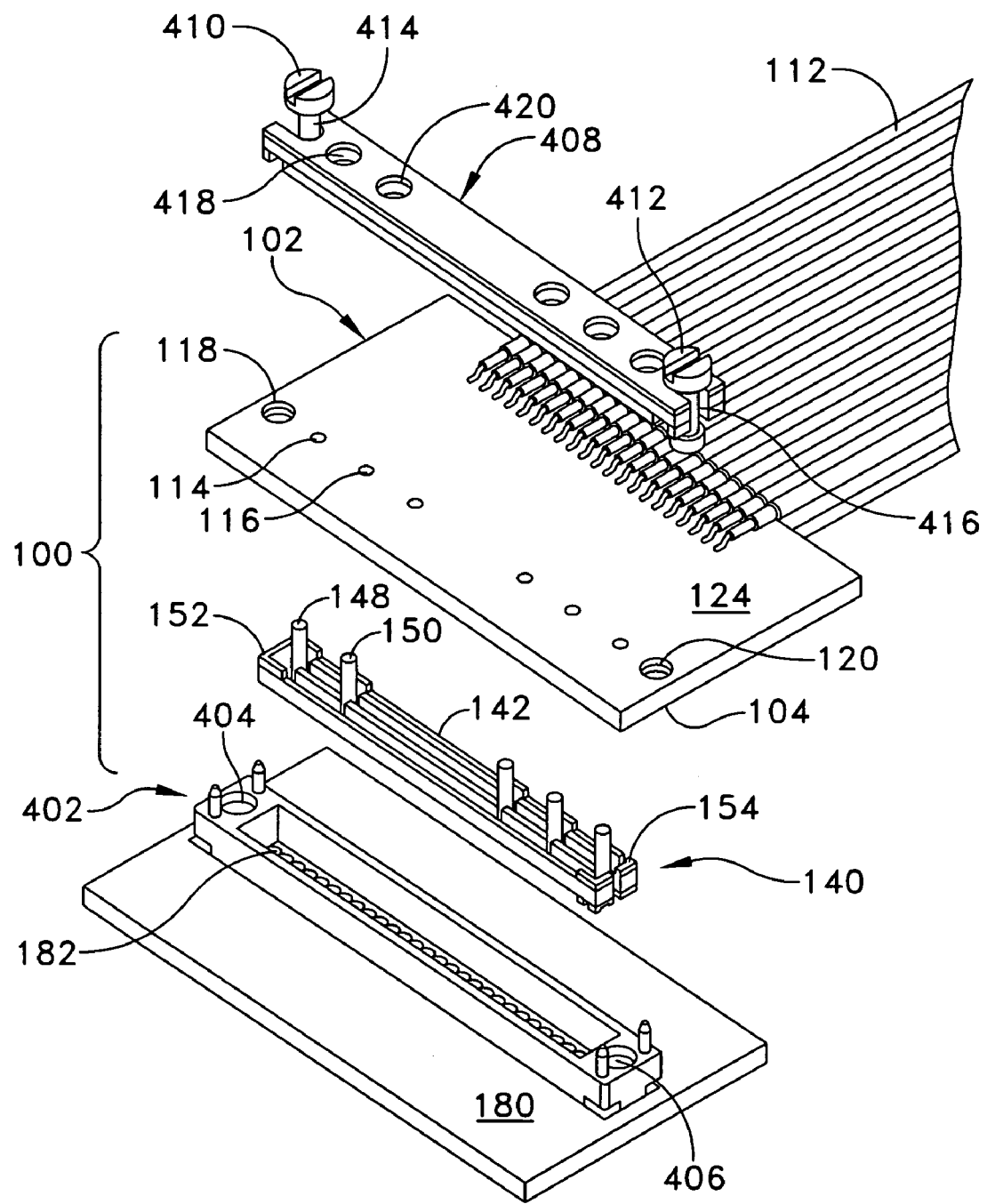
FIG. 4 illustrates a second exploded perspective view of the components of the probe shown in FIG. 1.

As shown in FIG. 4, a retention device 402 may be used to secure the probe 100 to a target board 180. In one embodiment, the retention device 402 and frame 140 comprise corresponding relief patterns that allow the frame 140 to press into, or clip to, the retention device 402. In the same or a different embodiment, the retention device 402 may also comprise features that are designed to mate with features of the plate 408. For example, the plate 408 may comprise holes or notches 414, 416 for receiving fasteners such as screws or bolts 410, 412 that pass through the plate 408 and into corresponding holes 404, 406 in the retention device 402. The screws or bolts 410, 412 may also pass through holes 118, 120 in the PCB 102. Clips or other mechanisms could also be used for this purpose, so long as they can provide a suitable force to hold the probe 100 in position (i.e., in contact with a plurality of test points 182, 184).

Figure 6:
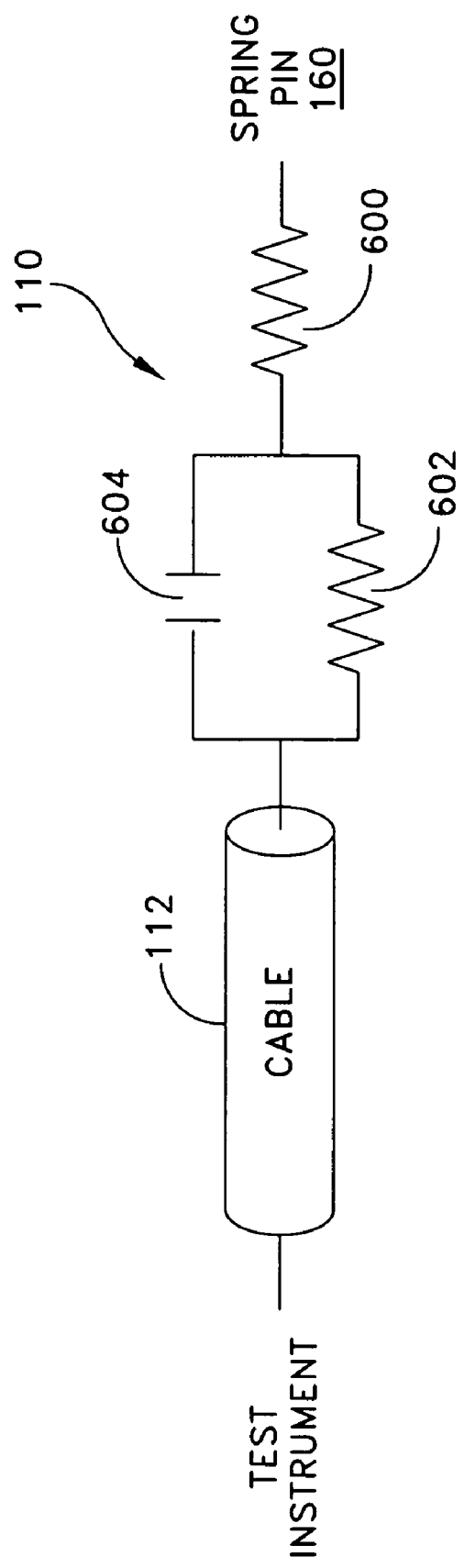
FIG. 6 illustrates exemplary tip-network components that may be included in the signal traces of the probe shown in FIG. 1.

As already alluded to, each of the signal routes 110 of the PCB 102 may comprise one or more tip-network components 600, 602, 604 that are preferably positioned adjacent the probe's spring pins 160, 162. By way of example, and as shown in FIG. 6, the tip-network components 600, 602, 604 of each signal route 110 may comprise an isolation resistor 600, as well as a tip resistor 602 connected in parallel with a tip capacitor 604. The combination of the tip resistor 602 and tip capacitor 604 may be coupled in series with the isolation resistor 600.

Figure 7:
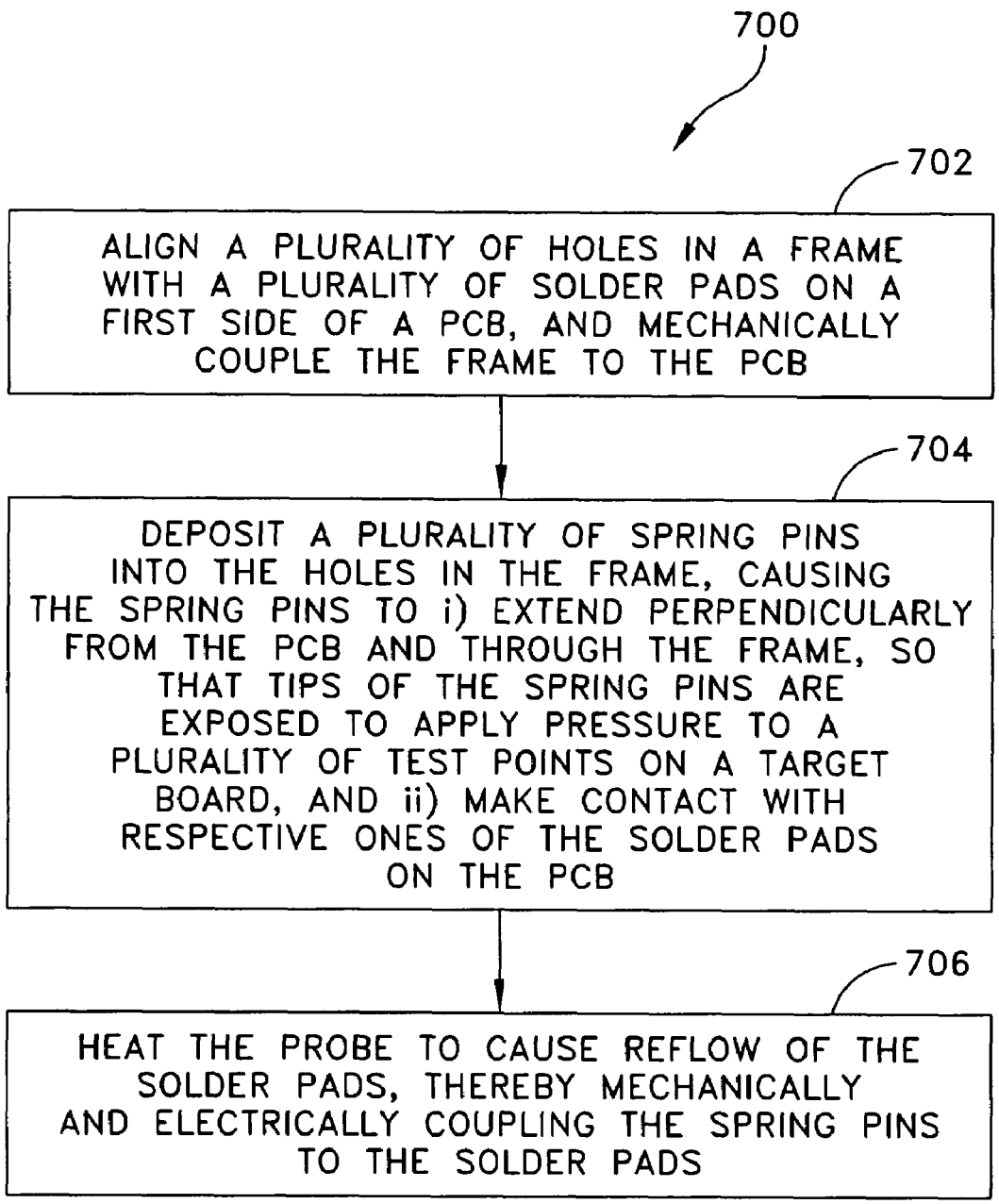
FIG. 7 illustrates an exemplary method of forming a test probe such as the one shown in FIGS. 1-4.

FIG. 7 illustrates one exemplary method 700 for forming a probe such as the probe 100. The method 700 commences with the alignment of i) a plurality of holes in a frame, with ii) a plurality of solder pads on a first side of a PCB (at block 702). The frame is then mechanically coupled to the PCB by, for example, one of the means already disclosed in this description (at block 702). Thereafter, a plurality of spring pins are deposited into the holes in the frame such that the spring pins extend perpendicularly from the PCB and through the frame, with their tips being exposed for the purpose of making contact with, and applying pressure to, a plurality of test points on a target board. Ends of the spring pins opposite their tips make contact with respective ones of the solder pads on the PCB. See, block 704. After fitting the pieces of the probe together, the probe is heated (at block 706) to cause reflow of the solder pads, thereby mechanically and electrically coupling the spring pins to the solder pads. In one embodiment, the probe may be heated in a reflow oven using conventional techniques.

What is claimed is:

1. A probe for probing test points on a target board, comprising:

a printed circuit board (PCB) having i) a first side with a plurality of solder pads thereon, ii) a second side, opposite the first side, iii) a plurality of signal routes that are electrically coupled to the solder pads for routing signals to a test instrument, and iv) a plurality of holes therein;

a frame, mechanically coupled to the PCB, having i) a main body portion with a plurality of holes therein, the holes in the frame being aligned with the plurality of solder pads on the first side of the PCB, and ii) a plurality of posts that extend from the main body portion of the frame into the plurality of holes in the PCB;

a plurality of spring pins for probing the test points on the target board, each spring pin of which is i) disposed in one of the holes in the frame, perpendicularly abutting the first side of the PCB, and ii) electrically coupled to one of the solder pads; and a plate adjacent the second side of the PCB, the plate having a plurality of holes therein to receive the plurality of posts extending from the main body portion of the frame, and the plate being mechanically coupled to the frame via the plurality of posts.

2. The probe of claim 1, wherein the probe further comprises an adhesive, in contact with the posts and the plate, to mechanically couple the frame to the plate, and thus to the PCB.

3. The probe of claim 2, further comprising a plurality of fasteners that extend through the plate toward the second side of the PCB; the fasteners being configured and positioned to mate with a retention device on the target board.

4. The probe of claim 1, wherein the frame further comprises a plurality of feet, extending perpendicularly from the main body portion of the frame and abutting the first side of the PCB, to provide a predetermined spacing between the main body portion of the frame and the first side of the PCB.

5. The probe of claim 1, wherein the signal routes comprise tip-network components positioned adjacent the spring pins.

6. The probe of claim 5, wherein the tip-network components comprise isolation resistors.

7. The probe of claim 1, wherein the frame further comprises a relief pattern corresponding to a retention device on the target board, for mechanically coupling the frame to the retention device.

8. The probe of claim 1, wherein the frame is formed from a rigid, non-conductive plastic.

9. The probe of claim 1, wherein the probe further comprises a snap-type mechanism that mechanically couples the frame to the plate.

10. The probe of claim 1, wherein the probe further comprises a compression mechanism that mechanically couples the frame to the plate.

11. The probe of claim 1, wherein the posts comprise enlarged and slightly deformable ends that mechanically couple the frame to the plate.

* * * * *